United States Patent [19]
Pintchovski et al.

[11] Patent Number: 5,227,340
[45] Date of Patent: Jul. 13, 1993

[54] PROCESS FOR FABRICATING SEMICONDUCTOR DEVICES USING A SOLID REACTANT SOURCE

[75] Inventors: Faivel Pintchovski, Austin; Wilson D. Calvert, Round Rock, both of Tex.

[73] Assignee: Motorola, Inc., Schaumburg, Ill.

[21] Appl. No.: 807,665

[22] Filed: Dec. 16, 1991

Related U.S. Application Data

[63] Continuation of Ser. No. 474,610, Feb. 5, 1990, abandoned.

[51] Int. Cl.$^5$ .................. H01L 21/00; H01L 21/02; H01L 21/302; H01L 21/463
[52] U.S. Cl. .................................. 437/225; 437/228; 437/233; 437/235; 427/69; 427/70
[58] Field of Search ............... 437/225, 228, 248, 233, 437/235; 118/50, 715, 725; 219/64, 209, 424, 427; 427/69, 70

[56] References Cited

U.S. PATENT DOCUMENTS

| | | | |
|---|---|---|---|
| 4,557,950 | 12/1985 | Foster et al. | 437/233 |
| 4,727,241 | 2/1988 | McWilliams | 219/460 |
| 4,817,557 | 4/1989 | Diem et al. | 118/725 |

FOREIGN PATENT DOCUMENTS 0126973 7/1983 Japan .

OTHER PUBLICATIONS

Wolf, Silicon Processing for the VLSI Era, vol. 1, Lattice Press, 1986, p. 369.

Primary Examiner—Brian E. Hearn
Assistant Examiner—B. Everhart
Attorney, Agent, or Firm—John A. Fisher

[57] ABSTRACT

A solid source chemical vapor deposition apparatus and a CVD method for fabricating semiconductor devices are disclosed. In accordance with the process for fabricating semiconductor devices, a CVD reactor chamber having a solid reactant source apparatus coupled thereto is provided. The reactant source apparatus includes a container which can be heated in a controllable manner and which has a gas diffuser located in the container. The container is provided with gas input and output which are located so that a carrier gas can be passed through the gas diffuser and through a finely divided solid reactant source material which is positioned over the gas diffuser. The carrier gas together with any vapor derived from the solid reactant source material is conveyed from the outlet of the reactant source apparatus to the CVD reactor chamber. Semiconductor substrates are positioned in the CVD reaction chamber, are heated, and are subjected to the carrier gas and the source vapor to deposit a layer of the source material on the substrates.

9 Claims, 2 Drawing Sheets

PROCESS FOR FABRICATING SEMICONDUCTOR DEVICES USING A SOLID REACTANT SOURCE

This application is a continuation of prior application Ser. No. 07/474,610, filed Feb. 5, 1990 now abandoned.

BACKGROUND OF THE INVENTION

This invention relates generally to a process and apparatus for the fabrication of semiconductor devices, and more particularly to processing apparatus utilizing solid reactant sources and to a process for using such apparatus in the fabrication of semiconductor devices.

Chemical vapor deposition (CVD), and especially low pressure chemical vapor deposition (LPCVD) has become an essential process in the fabrication of semiconductor devices. Chemical vapor deposition provides a method for depositing thin conformal films of controlled thickness and composition. CVD has long been used, for example, for the deposition of polycrystalline silicon, silicon dioxide, silicon nitride, doped glasses, tungsten, titanium nitride, and the like. For each of these materials there is a readily available and easily usable reactant source in either gas or liquid form. For example, polycrystalline silicon is chemical vapor deposited by the dissociation of silane, and silicon nitride is chemical vapor deposited by the reaction of dichlorosilane and ammonia. Both silane and dichlorosilane are gases. Tungsten is deposited by the hydrogen reduction of tungsten hexafluoride, a liquid source.

The trend in the semiconductor industry is to fabricate devices with smaller and smaller physical size. As the size of the minimum device feature decreases to less than one micrometer and especially as it decreases to less than 0.5 micrometers, the need arises for the chemical vapor deposition of other materials beyond those commonly used materials enumerated above. For example, as the semiconductor technology advances, there is a need for the chemical vapor deposition of metals such as copper, gold, and other materials such as ferroelectric and superconducting materials. There are no readily available gaseous or liquid reactant sources for the chemical vapor deposition of these materials. Accordingly, because of the need to deposit such materials, solid reactant sources are being investigated. The solid sources which are available for the chemical vapor deposition of materials such as copper and gold, however, have very low vapor pressures. A low vapor pressure reactant source leads to problems of nonuniformity of the deposited film, both across a single substrate and from substrate to substrate within a commonly processed multiwafer lot, because of the limited amount of source vapor that can be supplied to the reaction. The nonuniformity results from source depletion in the reaction zone. Additionally, a low vapor pressure CVD reactant source leads to low reproducibility because of poor control of the reactant materials. In the past, when solid reactant sources have been used, the vapor has been pulled directly from the heated source or has been carried from the reactant source to the deposition reactor by passing a carrier gas over the surface of the source. In either case, the available source vapor is quickly depleted and a limited amount of source is carried to the deposition reactor.

In view of the growing need for solid reactant sources for the chemical vapor deposition of metals, metal oxides, and other materials for which a convenient gaseous or liquid source is not available, a need existed for a source apparatus and for a process for chemical vapor deposition which would utilize a solid reactant source and which would introduce enough reactant vapor into a deposition reactor to achieve acceptable film uniformity and reactor throughput, especially for the fabrication of semiconductor devices.

It is therefore an object of this invention to provide an improved process for chemical vapor deposition from a solid reactant source material in a controlled and consistent manner.

It is a further object of this invention to provide an improved method for fabricating a semiconductor device including chemical vapor deposition from a solid reactant source.

It is yet another object of this invention to provide an improved solid reactant source for a chemical vapor deposition reaction.

BRIEF SUMMARY OF THE INVENTION

The foregoing and other objects and advantages of the invention are achieved by utilizing a solid reactant source in which the surface area of the source material is maximized and the contact of that surface area by a carrier gas is maximized. In accordance with one embodiment of the invention, semiconductor devices are fabricated by a process which includes the steps of providing a heatable reaction chamber to which a reactant source apparatus is coupled. The reactant source apparatus includes a heatable container in which a gas diffuser is located. A finely divided solid reactant source material is placed in the dopant source apparatus in a position so that it overlays the gas diffuser. Means are provided for passing a carrier gas through the gas diffuser, around and past the finely divided source material so that it transports the vapors from the source to the heatable reaction chamber. A semiconductor device substrate is placed in the heatable reaction chamber and is heated to the desired reaction temperature. A carrier gas and the reactant source vapors transported by the carrier gas are conveyed to the heatable reaction chamber in proximity with the semiconductor device substrate. The gas diffuser disperses the carrier gas and causes it to pass through the finely divided solid reactant material in a manner which maximizes the contact between the carrier gas and the source material which, in turn, maximizes the amount of reactant vapor carried to the reactor chamber.

DETAILED DESCRIPTION OF PREFERRED EMBODIMENTS

Figure 1:
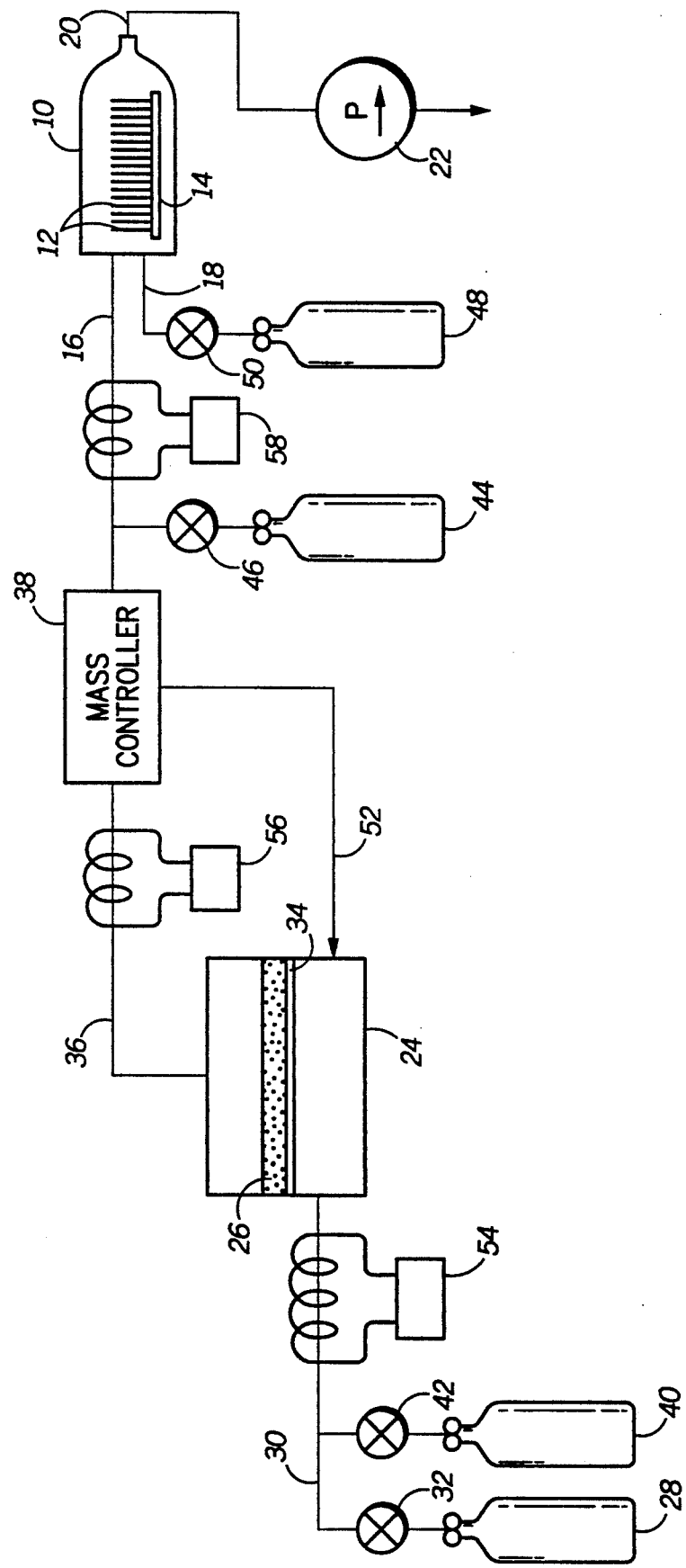
FIG. 1 schematically illustrates chemical vapor deposition apparatus for use in the practice of the invention.

FIG. 1 schematically illustrates chemical vapor deposition equipment suitable for practice of the invention. The apparatus includes a heatable reactor chamber 10 in which substrates to be deposited upon, such as semiconductor substrates 12, are placed. In this embodiment a plurality of substrates are shown in reactor chamber 10, but the invention is equally applicable to a single substrate reactor or to a multiple substrate reactor. Reactor chamber 10 is an enclosed chamber in which the reaction ambient is controlled. The substrates are placed in the chamber in a substrate holder or boat 14. Although not shown in this illustrative depiction, reactor chamber 10 is capable of being heated to an elevated reaction temperature. The heating is accomplished by resistive heat coils, heat lamps, or the like.

Inlet gas lines 16, 18 convey reactant species, carrier gases, and purging gases to reactor chamber 10. An exhaust line 20 removes reaction products, unused reactants, and the like from reactor chamber 10. A vacuum pumping system 22 controls the pressure within the reactor chamber and aids in the removal of gaseous material from the chamber.

In accordance with the invention, a reactant source apparatus 24 is provided from which reactant vapors are supplied to a reaction within chamber 10. The reaction vapors are derived from a finely divided solid reactant source 26 contained in the reactant source apparatus. A carrier gas is conveyed to the reactant source apparatus from a source 28 through a gas line 30. Appropriate controls 32 control the volume of the carrier gas flowing in line 30. Reactant source apparatus 24 includes a gas diffuser 34 upon which the finely divided solid reactant source material is placed. Gas line 30 enters the reactant source apparatus at a position below gas diffuser 34 so that the carrier gas from source 28 flows into the reactant source apparatus, through the bottom gas diffuser, and through the finely divided solid reactant source material. The carrier gas and reactant source vapors which are carried by the carrier gas exit the reactant source apparatus through a gas line 36. Gas line 36 conveys the carrier gas and the reactant vapors to a mass controller 38 which monitors and controls the amount of reactant vapor being carried to reactor chamber 10. The carrier gas and reactant source vapor flows from the mass controller to the reactor chamber through inlet 16.

Additional reactants or diluents may be added to the carrier gas from a source 40 located upstream from the reactant source apparatus and controlled by control means 42. Additional reactants and or diluents may be added to the carrier gas and reactant vapor source from a source 44 under the control of control means 46. Still further reactants, diluents, or purging gases may be admitted to reactor chamber 10 from a source 48 controlled by control means 50. Each of the control means can include mass flow controllers, needle valves, fixed orifices, or the like. The various carrier gases, diluents, and reactant sources allow the desired reaction components to be mixed and adjusted at various locations in the process. For example, source 44 allows a second reactant or diluent to be mixed with the vapor source from reactant source apparatus 24 before entering reactor chamber 10. In contrast, source 48 allows a reactant or diluent to be mixed with vapors from reactant source 24 within reactor chamber 10. The particular choice of reaction components and when they are mixed will depend, of course, upon the particular material being chemical vapor deposited.

In accordance with one embodiment of the invention, reactant source 24 includes a heatable container within which gas diffuser 34 and reactant source material 26 are contained. The temperature of the reactant source material determines the amount of source vapor available from the source in accordance with the vapor pressure-temperature relationship for that material. The preferred apparatus for carrying out the inventive process includes a feedback 52 from mass controller 38 to the heater which controls the temperature of reactant source apparatus 24. The amount of vapor contained in the carrier gas stream is determined by mass controller 38 and that information is fed back to a heater control (not shown) which adjusts the temperature of the reactant source apparatus to maintain that apparatus at the desired temperature to thereby maintain the vapor concentration at the desired value. The reactants conveyed to reactor chamber 10 in vapor form will generally be at an elevated temperature. To avoid condensation or deposition of the reactant source material on the gas lines, those gas lines are preferably heated by heaters indicated at 54, 56, and 58.

Figure 2:
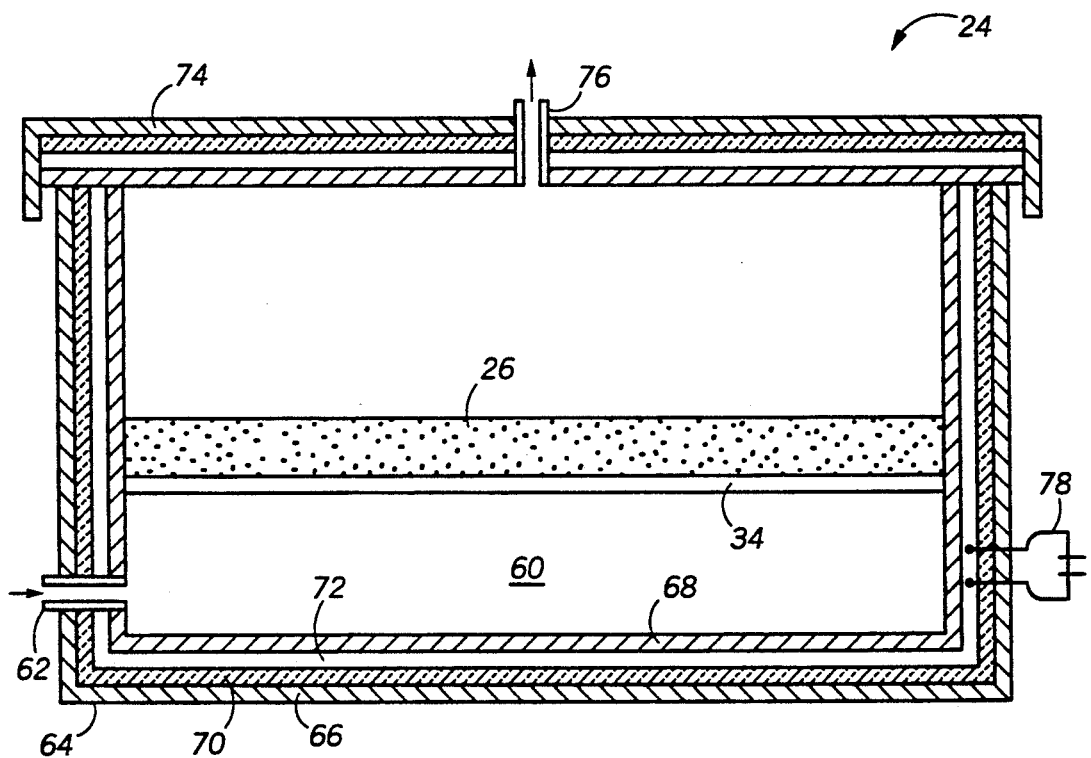
FIG. 2 illustrates schematically, in cross section, reactant source means in accordance with the invention.

Reactant source apparatus 24 is disclosed in more detail in FIG. 2 in which a preferred embodiment is depicted. In the preferred embodiment, reactor source apparatus 24 has an integral, embedded heater encompassing the entire container and thus creating a near isothermal environment within the container. This minimizes vapor loss by solidification in cold areas of the container. The source vapor removal efficiency is improved, in accordance with the invention, by maximizing the solid source surface area which is exposed to carrier gas flow. Within apparatus 24 this is accomplished by placing finely divided solid reactant source material 26 directly over a gas diffuser 34. Carrier gas, and preferably preheated carrier gas, enters the bottom portion of the apparatus 60 through an inlet 62. The carrier gas is dispersed through the gas diffuser and is forced through the finely divided source material. The dispersal of the carrier gas by the gas diffuser and the use of finely divided material maximizes the source material surface area exposed to the carrier gas to maximize the efficiency of vapor removal by the carrier gas.

Reactant source apparatus 24 includes a multi walled container 64 having an outer wall 66 and an inner wall 68. Sandwiched between the inner and outer walls is a layer of insulation 70 and a heater 72. Heater 72 is preferably distributed about the entire periphery of the container to uniformly heat the entire container, including the lid 74 which is of the same multiwall construction. An outlet 76 in the container allows the removal of the carrier gas and the reactant vapor from the reactant source apparatus. Heater 72 is connected to an electrical power control indicated schematically at 78 and, in the preferred embodiment, to mass controller 38 as illustrated in FIG. 1. The inner wall 68 of the chamber is preferably metal or other efficient heat conductor to aid in providing an isothermal environment within the container. Gas diffuser 34 can be sintered stainless steel, a glass frit, or the like. Gas diffuser 34 is selected to provide an efficient diffusion of the carrier gas passing therethrough. Diffuser 34 can be selected to have a predetermined nominal pore size to control the rate of gas flow through the apparatus. This rate of gas flow can be varied depending upon the particular chemical vapor deposition application.

Solid reactant source material 26 is finely divided to maximize the surface area. The solid reactant source material is selected for the particular chemical vapor deposition application. For example, copper can be deposited by chemical vapor deposition from a finely divided copper metalorganic compound with $\beta$-diketonate ligand, with or without fluorine bearing radicals. Similarly, gold can be chemical vapor deposited from a compound such as finely divided dimethylgold acetylacetonate. Similar solid source materials are available, for example, for the deposition of ferroelectric materials, barium titanate, and the like.

The use of an internal heating mechanism 72, besides providing an isothermal environment within the chamber, allows for a rapid change of temperature. The rapid response of the internal heater is in contrast to an oil bath or other type of external heater. The rapid response, in turn, allows for the efficient use of the feedback loop from mass controller 38. If the controller indicates that the source is being depleted, for example, the automated temperature controller, in response to a signal from the mass controller, can quickly raise the temperature of the reactant source apparatus to quickly increase and correct the source vapor level.

The following nonlimiting examples serve to further explain the invention and to illustrate preferred embodiments thereof.

EXAMPLE 1

A copper film is deposited by low pressure chemical vapor deposition onto a plurality of semiconductor substrates in the following manner. A plurality of silicon substrates having a patterned silicon dioxide layer on a front surface thereof are placed within the reactor chamber in a quartz boat so that the substrates are standing vertically with the broad surfaces parallel to each other and perpendicular to the flow of reactants entering the chamber. Finely divided copper hexafluoro acetylacetonate having a mesh particle size of about 200 is loaded onto a sintered stainless steel gas diffuser in a solid source apparatus as discussed above. The source apparatus is cylindrical with a diameter of about 23 cm and a height of about 8 cm. The source is maintained at a source temperature of about 90° C. A hydrogen carrier gas is passed through the solid source apparatus and carries the reactant vapor from the reactant source to the reactor. The semiconductor substrates in the reactor are maintained at a temperature of about 250° C. The vapor reacts on the surfaces of the heated semiconductor substrates in the presence of the hydrogen carrier gas for 15 minutes after which the flow of reactants is terminated and the substrates are removed from the reactor chamber. The substrates are observed to be covered by a uniform layer of copper.

In additional examples, with conditions otherwise kept the same, the source temperature is varied in the range of about 60°-90° C., the substrate temperature is varied in the range of about 150°-350° C., and the mesh particle size is varied from about 150 to about 600. In some examples the carrier gas is selected to be argon or helium. When using these inert carrier gases, it is necessary to add hydrogen gas to the reactor. In each case satisfactory results are obtained. The thickness of the deposit varies as expected, with greater thickness achieved for the higher source and reactor temperature and the finer mesh size.

EXAMPLE 2

A gold film was deposited on a plurality of semiconductor substrates by low pressure chemical vapor deposition processes similar to those described in Example 1. The source material was finely divided dimethylgold acetylacetonate of 150-600 mesh particle size. The source apparatus temperature was maintained in the range of 50°-80° C. and the reaction temperature was maintained in the range of 125°-300° C. The resultant gold films formed on the surfaces of the substrates are observed to be uniform.

Thus it is apparent that there has been provided, in accordance with the invention, apparatus and methods for chemical vapor deposition and for the fabrication of semiconductor devices which fully meets the objects set forth above. Although the invention has been described and illustrated with reference to specific embodiments thereof, it is not intended that the invention be limited these illustrative embodiments. Those skilled in the art will recognize that variations and modifications can be made without departing from the spirit of the invention. For example, additional reactants can be used in the deposition process in addition to the reactants derived from the solid source material and these reactants can be introduced and mixed in ways other than those illustrated. Similarly, the control mechanisms used to control the flow of gaseous carriers can be changed in accordance with conventional usage. Other solid sources than those enumerated can be utilized. It is therefore intended that all such variations and modifications that fall within the scope of the appended claims be included within the invention.

What is claimed is:

1. A process for fabricating semiconductor devices comprising the steps of:
   providing heatable reaction chamber means for receiving a reactant gas;
   providing a mass controller, coupled to the heatable reaction chamber means, to measure the amount of the reactant gas flowing into the heatable reaction chamber means;
   providing a reactant source chamber coupled to said mass controller, said reactant source chamber comprising:
   a self-heating container;
   a continuous gas diffuser plate made of a porous material located in said container and having a porosity sufficiently high for flowing gas therethrough and sufficiently low for preventing the passage of finely divided solid material;
   means for passing a carrier gas through said continuous gas diffuser plate; and
   means for conveying said carrier gas to said mass controller;
   placing a finely divided solid reactant source material in said reactant source chamber and positioned on and physically supported by said continuous gas diffuser plate;
   positioning a semiconductor device substrate in said heatable reaction chamber means;
   heating said semiconductor device substrate;
   passing a carrier gas through said continuous gas diffuser plate and through said finely divided solid reactant source material to produce the reactant gas and carrying the reactant gas to the mass controller and into said heatable reaction chamber means to the proximity of said semiconductor device substrate;
   measuring the amount of reactant gas flowing into the heatable reaction chamber using the mass controller; and
   adjusting the heat of the finely divided solid reactant source material, the continuous gas diffuser plate, and the carrier gas by adjusting the heat of the self-heating container, in response to measuring the amount of reactant gas flowing into the heatable reaction chamber, to obtain a desired level of the flow of the reactant gas.

2. The process of claim 1 wherein said step of providing a reactant source chamber comprises providing a reactant source chamber comprising a self-heating container having a first outer layer, a second insulating layer, a third heater layer, and a fourth inner layer.

3. The process of claim 1 wherein said step of providing a reactant source chamber comprises providing a reactant source chamber comprising a continuous gas diffuser plate comprised of sintered stainless steel.

4. A process for fabricating semiconductor devices comprising the steps of:

providing a heated semiconductor device substrate;

providing a reactant source chamber including a self-heating enclosure, a continuous gas diffuser plate made of a porous material positioned within said enclosure, and means for passing a carrier gas through said continuous gas diffuser plate, said gas diffuser plate having a porosity sufficiently high for flowing gas therethrough and sufficiently low for preventing passage of a finely divided solid material;

placing a granulated solid reactant source material on said continuous gas diffuser plate in said reactant source chamber;

causing a carrier gas to enter said reactant source chamber, pass through said continuous gas diffuser plate, pass through said granulated solid reactant source material to produce a reactant gas, and carry the reactant gas from said reactant source chamber to said heated semiconductor device substrate and react at the surface thereof to chemically vapor deposit thereon;

providing a mass controller to measure the amount of the reactant gas flowing from said reactant source chamber to said heated semiconductor device substrate;

measuring the amount of reactant gas flowing from said reactant source chamber; and adjusting the heat of the granulated solid reactant source material, in response to measuring the amount of reactant gas flowing from said reactant source chamber, to obtain a desired level of the flow of the reactant gas.

5. A process for chemical vapor deposition on a substrate comprising the steps of:

providing a source of finely divided solid reactant source material;

providing a continuous gas diffuser plate made of a porous material for dispersing a carrier gas through said reactant source and physically supporting said reactant source, said gas diffuser plate having a porosity sufficiently high for flowing gas therethrough and sufficiently low for preventing passage of said powder reactant source material;

providing means for controlling the temperature of said reactant source material;

providing a reaction chamber for controlling the reaction conditions of a chemical vapor deposition reaction;

placing said substrate in said reaction chamber and heating said substrate to a reaction temperature;

heating said reactant source material to a source temperature;

passing a carrier gas through said gas diffuser plate and through said reactant source material to produce source vapors from said source material;

conveying said carrier gas and said source vapors to said heated substrate;

providing a mass controller to measure the amount of vapors flowing from said reactant source material to said heated substrate;

measuring the amount of vapors flowing from said reactant source material to said heated substrate;

adjusting the source temperature in response to measuring said vapors to obtain a desired level of flow of said vapors to said heated substrate.

6. The process of claim 5 wherein said step of providing means for controlling temperature of the reactant source material comprises the steps of:

providing a mass controller for determining the amount of source vapors carried by said carrier gas;

providing feedback means from mass controller to said means for controlling temperature; and controlling said reactant source material temperature in response to the amount of source vapors determined by the mass controller to obtain a desired amount of source vapors.

7. The method of claim 1 wherein the step of placing a finely divided solid reactant source comprises placing a powder on said gas diffuser plate, said powder having a size sufficient to pass through a mesh size of 150.

8. The method of claim 4 wherein the step of placing a granulated solid reactant source material comprises placing a powder on said gas diffuser plate, said powder having a size sufficient to pass through a mesh size of 150.

9. The method of claim 5 wherein the step of providing a source of finely divided solid reactant source material comprises providing a powder having a size sufficient to pass through a mesh size of 150.

* * * * *